Aug. 16, 1960 E. D. JACKSON 2,949,498

SOLAR ENERGY CONVERTER

Filed Oct. 31, 1955 2 Sheets-Sheet 1

INVENTOR

EDMOND D. JACKSON

BY Stevens, Davis, Miller & Mosher

ATTORNEYS

Aug. 16, 1960 E. D. JACKSON 2,949,498

SOLAR ENERGY CONVERTER

Filed Oct. 31, 1955 2 Sheets-Sheet 2

INVENTOR

EDMOND D. JACKSON

BY Stevens, Davis, Miller and Mosher

ATTORNEYS 2,949,498

SOLAR ENERGY CONVERTER

Edmond D. Jackson, Dallas, Tex., assignor to Texas Instruments Incorporated, Dallas, Tex., a corporation of Delaware Filed Oct. 31, 1955, Ser. No. 543,846

17 Claims. (Cl. 136—89)

Figures 1, 2:
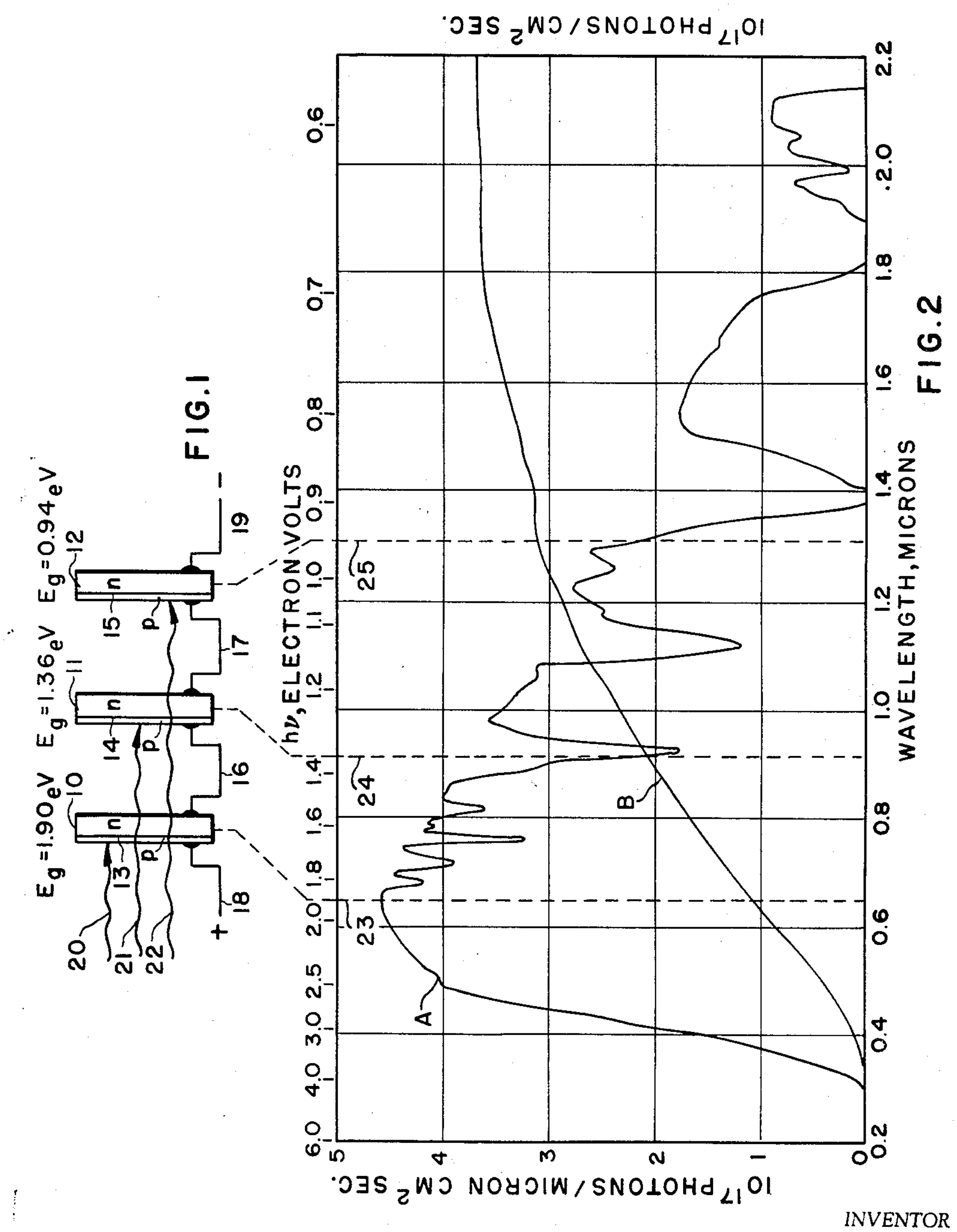

This invention relates to an improved type of solar energy converter and, more particularly, to a multi-layer semiconductor solar energy converter in which each semiconductor layer has a different energy gap and is so arranged with respect to the other layers that it functions in the comparatively narrow region of the solar spectrum in which it is most efficient.

Conversion of solar radiations into electrical power by means of silicon p–n junction photocells is a comparatively recent development in the art of semiconductors. Discussions of these solar energy converters have appeared in such articles as "A New Silicon P–N Junction Photocell for Converting Solar Radiation into Electrical Power," by Chapin, Fuller and Pearson, Journal of Applied Physics, vol. 25, page 676 (1954); "Use of Silicon P–N Junctions for Converting Solar Energy to Electrical Energy," by Cummerow, Physical Review, vol. 95, page 591 (1954); "Radioactive and Photoelectric P–N Junction Power Source," by W. G. Pfann and W. van Roosbroeck, Journal of Applied Physics, vol. 25, page 1422 (1954); and, "Silicon Solar Energy Converters," by Prince, Journal of Applied Physics, vol. 26, page 534 (1955).

The photocell now used in solar energy converters consists of a very thin wafer of silicon which has an electron rich n-region and a hole rich p-region. In the silicon wafer, the n-type region is produced by donor impurities and, since the donor impurities in the lattice structure contribute an excess or free electron, the impurity atoms in the n-type region have a net positive charge. Conversely, acceptor impurities produce the p-type region of the wafer, and in the lattice structure, require an electron to complete their valence bond with the silicon atoms. Consequently, the acceptor impurity atoms have a net negative charge. As a result of the positive charge on the donor atoms and the negative charge on the acceptor atoms, an electric field exists at the junction between the two regions which keeps electrons in the n-type region and holes in the p-type region. When light particles, hereinafter referred to as photons, are absorbed by the silicon crystal, it gives rise to hole-electron pairs in the conduction band. The electric field existing in the wafer then forces the holes into the p-region and the electrons into the n-region thereby making the p-region positive and the n-region negative. Displacement of these newly freed charges causes a voltage between the crystal ends which then supply electrical power to an external circuit.

The energy of the sun reaching the earth's surface is approximately eighty-five trillion kilowatts ($85 \times 10^{12}$ kw.) or, expressed differently, one thousands watts per square meter of the earth's surface. A silicon p–n junction photocell of a unit area, though, cannot convert all of the photons incident upon it into electrical power for various reasons. Some of these reasons are (1) a relatively large number of the photons incident on an untreated semiconductor surface suffer reflection and are lost, (2) of the photons entering the semiconductor, many are either transmitted on through the material or absorbed at some distance from the junction thus creating carrier pairs which suffer recombination without contributing to the useful converter output, and (3) of the carrier pairs which are separated by the junction, a portion are lost due to the forward leakage current through the converter. However, neglecting all of these reasons, a silicon p–n junction photoelectric energy converter still has only a maximum theoretical conversion efficiency for sunlight of about 22%. The reasons for the 22% theoretical limit of energy conversion are directly related to the energy gap of silicon or, in other words, the energy required to raise an electron in the valence band to the conduction band. The energy gap of silicon, which is 1.11 electron volts and is the amount of energy present in light wavelengths of 1.2 microns, causes silicon to be transparent to wavelengths greater than 1.2 microns so that no carriers are generated by that portion of the sun's radiations longer in wavelength than 1.2 microns. Further, only 1.11 electron volts of energy from each photon absorbed are used in the separation of hole-electron pairs in the crystal and thus, any excess energy of the shorter wavelength, high energy photons is uselessly dissipated as heat. It follows that while silicon is a very good material for converting light to electrical power in the wavelength region from about 0.8 to 1.2 microns, the inherent semiconductor characteristics of silicon limits its efficiency as a light energy converter.

In the present invention, a solar energy converter with a higher efficiency than that obtainable with the silicon photocell has been achieved by utilizing multiple layers of semiconductor material with each semiconductor layer having an energy gap different from the others. In the preferred practice of this invention, the solar spectrum is divided into three or more wavelength regions such that the number of incident photons in the wavelength regions of interest are equal. A first semiconductor material is selected whose energy gap is approximately equal to the photon energy of the long wavelength edge of the shortest wavelength division of the solar spectrum. Then, a second semiconductor material is selected whose energy gap corresponds to the long wavelength edge of the next shortest wavelength division of the solar spectrum and so on until semiconductor material with an appropriate energy gap is selected for each division of the spectrum. The various layers of semiconductor material, each containing a p–n junction and fabricated into very thin wafers, are so ordered that the layer with the largest energy gap is positioned to receive the light energy first and the other layers are arranged in the descending order of their energy gap.

The multi-layer solar energy converter operates in the following manner. The high energy photons, that is, the energy contained in the shorter wavelengths and in the wavelengths equivalent to the energy gap of the first layer, are absorbed in the first layer thus giving rise to hole-electron pairs. This layer is sufficiently thin and transparent to wavelengths beyond its absorption edge, that is, the point at which the energy contained in a wavelength falls below the energy gap of the material, so that the unabsorbed light passes through to the next layer. The second layer then absorbs the photon energy in the next shorter wavelengths and in the wavelengths equivalent to its energy gap and hole-electron pairs are, likewise, produced in this layer. The energy in wavelengths of light beyond the absorption edge of the second layer is transmitted to the third and successive layers, each layer absorbing the photon energy remaining in the shorter wavelengths and in the wavelengths equivalent to its energy gap and giving rise to hole-electron pairs. It will be observed that each layer functions only in the comparatively narrow region of the spectrum in which it is most efficient. Since the spectrum has been so divided that the number of photons absorbed by each layer is the same, essentially equal currents are produced in each layer and the layers may thus be connected in series.

Accordingly, it is an object of this invention to provide means for converting energy to electrical power at a higher efficiency than that attainable heretofore.

It is another object of this invention to provide a solar energy converter composed of multiple layers of semiconductor material with each semiconductor layer having a different energy gap and so arranged with respect to the other layers that it receives light wavelengths in the region in which it is most efficient.

It is still another object of this invention to divide the solar spectrum into such a number of wavelength regions as to utilize a significant portion of the photon energy and to choose semiconductor materials with energy gaps corresponding to the longest wavelength in each of the spectrum divisions.

It is a still further object of this invention to produce equal currents in each of a number of semiconductor layers of a solar energy converter by dividing the solar spectrum into wavelength regions so that the number of photons absorbed by the semiconductor layer for each wavelength region is equal.

Figure 3:
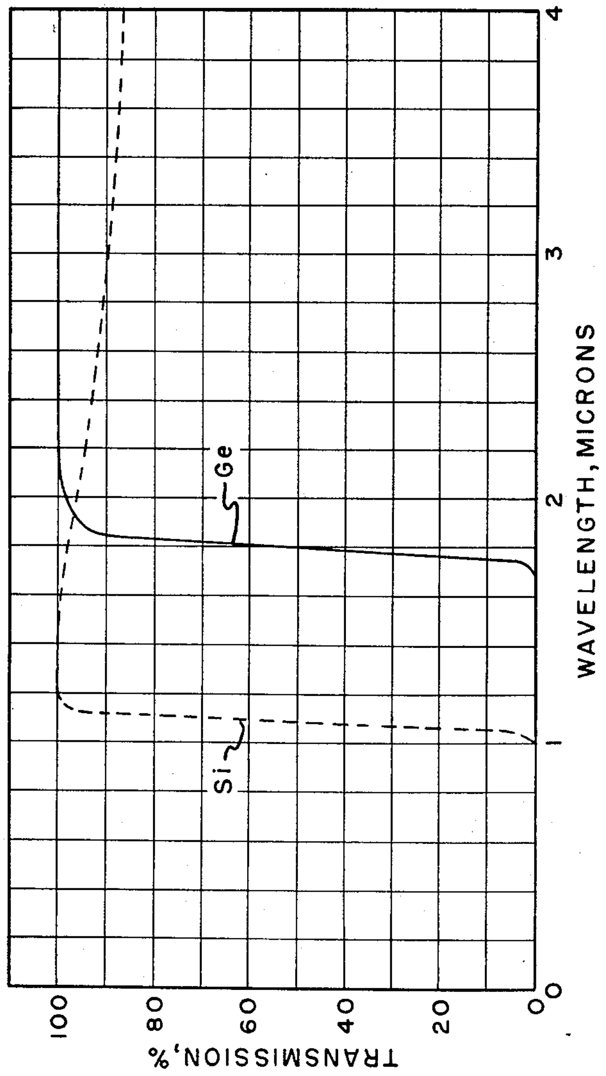

The above objects will be further clarified and other objects made known from the following description when taken in conjunction with the drawings in which:

Figure 1 is a schematic representation of a three layer semiconductor solar energy converter constructed in accordance with the present invention;

Figure 2 is a plot of two curves, designated as A and B, against either wavelength in microns or energy in electron volts in which curve A represents the photons incident upon the surface of the earth in micron sec. $cm.^2$ and curve B is the integral of curve A in $10^{17}$ photons/$cm.^2$ sec.; and Figure 3 shows curves of light transmission in percent for silicon and germanium as a function of wavelength in microns.

Referring now to the drawings, Figure 1 shows a schematic representation of one embodiment of this invention. The solar energy converter of Figure 1 consists of three layers of semiconductor material, layers 10, 11 and 12. Each of the semiconductor layers 10, 11 and 12 is comprised of a p-region and an n-region whereby the p-n junctions 13, 14 and 15, respectively, are formed therebetween. The layers are advantageously of a size ½" x ½" and have a thickness of 0.020". The p-n junction for each layer is produced by diffusing into n-type material a p-type impurity to a depth dependent upon the semiconductor material of the layer. The dependence of the diffusion depth upon the semiconductor material results from the fact that the optical absorption constant of semiconductors is, in general, of such a nature that, for photon energies large compared to the energy gap of the material, the energy is attenuated very rapidly thereby causing generation of hole-electron pairs very close to the surface. In silicon, for example, at a wavelength of 0.5 micron, 97% of the carriers are freed within $10^{-5}$ centimeters of the surface. Thus, to prevent loss through recombination, it is desirable for the p-n junction to be produced in the layer within a minority carrier diffusion length or so from the depth of maximum generation of hole-electron pairs.

It will be noted that layers 10, 11 and 12 have been designated as having energy gaps equal to 1.90 E.V., 1.36 E.V., and 0.94 E.V. respectively. As will be explained more fully below, the energy gaps of the materials have been chosen so that approximately equal currents will be produced thus permitting the layers to be connected in series. The layers of Figure 1 are shown connected in series with the n-region of layer 10 connected to the p-region of layer 11 by lead 16 and the n-region of layer 11 connected to the p-region of layer 12 by lead 17.

Lead 18, connected to the p-region of layer 10 represents the positive connection to the solar energy converter and lead 19, connected to the n-region of layer 12 represents the negative voltage connection to the solar energy converter. Various means of connecting the leads to the semiconductor layers are now well-known in the art and it is not considered necessary to describe in detail the manner of making such connections. It should be pointed out here that a series connection can also be achieved merely by stacking the layers 10, 11 and 12 adjacent to each other thereby eliminating the connecting leads 16 and 17.

In constructing a solar energy converter with multiple layers, for example the layers 10, 11 and 12, it is essential to select semiconductor materials with different energy gaps for each of the layers. For this purpose, semiconductors are available from the group comprised of the elements in group IV of the periodic table, the intermetallic compounds of elements in groups III and V of the periodic table and the compounds of elements in groups II and VI of the periodic table. The relationship between the semiconductor elements in group IV and between the semiconductor compounds of elements in groups III and V and groups II and VI is that the lighter elements, appearing in the upper part of each group, have a larger energy gap than do the heavier elements or compounds. To illustrate, in group IV, silicon is lighter than germanium and has a larger energy gap; in the group III and V compounds, gallium arsenide (GaAs) is lighter than indium antimonide (InSb) and has a larger energy gap; and similarly, in the groups II and VI compounds, zinc sulfide (ZnS) is lighter than cadmium selenide (CdSe) and has a larger energy gap.

Thus, it is clear that the compounds available from the group III and V and group II and VI elements, together with the elements from group IV, represent a large number of semiconductors each with a different energy gap. Further, as has been disclosed in Patent No. 2,710,253, issued June 7, 1955, to R. K. Willardson et al., it is possible to produce solid solutions of compounds such as aluminum antimonide and gallium antimonide and thereby produce semiconductors with energy gaps intermediate to the energy gap of either parent composition. It follows from the above that, when the solar spectrum has been divided into a number of wavelength regions, any one of a number of semiconductors with the required energy gap may be selected for the layers 10, 11 and 12.

As mentioned above, the energy gaps of 1.90 E.V. for layer 10, 1.36 E.V. for layer 11 and 0.94 E.V. for layer 12 were selected in order to provide approximately equal current in each layer and thus permit the layers to be connected in series. The selection of energy gaps to accomplish this purpose can be best explained by referring to the curves of Figure 2. In this figure, the abscissa of the curves may be read either in terms of wavelength in microns or in terms of energy in electron volts ($h\nu$). The relation between wavelength and energy in electron volts is expressed by the formula:

$$\lambda = hc^2/(1.591\times10^{-12})e$$

where $h$=Planck's constant
$c$=velocity of light
$(1.591\times10^{-12})e$=energy in electron volts Therefore, from this formula, it can be seen that the higher photon energy is contained in the shorter wavelengths and decreases as the wavelength increases. Plotted against the abscissa, either wavelengths in microns or energy in electron volts, are the curves A and B. Curve A represents the photons incident upon the surface of the earth in $10^{17}$ photons/micron sec. $cm.^2$ as a function of wavelength and curve B represents the integral of curve A in $10^{17}$ photons/$cm.^2$ sec. The dotted lines 23, 24 and 25, drawn between the electron volt and the wavelength scales, intersect the integral curve B in such a manner that the solar spectrum is divided into wavelength regions containing approximately equal numbers of photons. The continuation of the dotted lines 23, 24 and 25 from the scale of energy in electron volts represents the energy gap required of each layer 10, 11 and 12 to separate the spectrum into the wavelength regions of equal numbers of photons. Reading then between the intersection of lines 23, 24 and 25 with curve B, it can be seen that layer 10 receives $1.07 \times 10^{17}$ photons/cm.$^2$ sec. with an energy above 1.90 E.V. ($\lambda$=0.65 micron), layer 11 receives $2.02 \times 10^{17}$ photons/cm.$^2$ sec. with an energy above 1.36 E.V. ($\lambda$=0.91 micron) and below 1.90 E.V. ($\lambda$=0.65 micron) and layer 12 receives $3.06 \times 10^{17}$ photons/cm.$^2$ sec. with an energy above 0.95 E.V. ($\lambda$=1.31 microns) and below 1.36 E.V. ($\lambda$=0.92 micron).

The photon energy falling upon the layers 10, 11 and 12 is represented in Figure 1 by the lines 20, 21 and 22. Line 20 represents photon energy greater than or equal to 1.90 E.V., line 21 represents photon energy greater than or equal to 1.36 E.V. and line 22 represents photon energy greater than or equal to 0.94 E.V. All of the light waves are first incident upon layer 10 and, the photon energy contained in the line 20 being greater than 1.90 E.V. the photons are absorbed in layer 10 thus giving rise to hole-electron pairs. The photon energy of lines 21 and 22, being less than 1.90 E.V. are transmitted on through layer 10 to layer 11. The photon energy in line 21 is greater than 1.36 E.V. and thus, the photons in line 21 are absorbed in layer 11 giving rise to hole-electron pairs. As in the case of layer 10, layer 11 is transparent to the photon energy of line 22 and this energy is transmitted on to layer 12 where it is absorbed thus giving rise to hole-electron pairs in layer 12. Since the photons absorbed in each of the layers are approximately equal in number, it follows that equal currents are produced in each of the layers and the arrangement described permits them to be connected in series.

The opaque character of semiconductor materials to photon energies above their energy gap and transparent character to photon energies below their energy gap is well illustrated by Figure 3 wherein the transmission characteristics for silicon and germanium are shown. In this figure, the dashed line for silicon shows that it is completely opaque to light waves of a length shorter than one micron but that, for wavelengths above 1.1 microns, there is practically 100% transmission of light waves of a length up to two microns. Then, the transmission in percent of silicon begins to drop off for longer wavelengths. The solid line curve for germanium shows that it is essentially opaque for wavelengths up to 1.67 microns and the transmission in percent of light waves increases sharply until wavelengths of 2.25 microns are reached and thereafter the tranmission is 100%.

The curves of Figure 3 also illustrate another important feature of energy converters constructed in accordance with this invention. This feature takes into account the fact that only the energy in photons equal to the energy gap of the semiconductor material is useful in producing hole-electron parts, the remainder being uselessly dissipated as heat. Thus, as shown by Figure 3, semiconductor layers with a low energy gap, i.e. germanium, are shielded from high photon energies by layers with larger energy gaps, i.e silicon. This permits an arrangement of layers in the descending order of their energy gaps with the consequent result that each layer operates in the wavelength region in which it is most efficient and thereby dissipates a lesser amount of photon energy as heat.

To illustrate more specifically the application of the principles of this invention, two examples of a three layer solar energy converter are given as follows. In the converter of the first example, the semiconductor materials comprising the layers were cadmium selenide, silicon, and gallium antimonide. The energy gaps and currents of the layers in the order as named were 1.74 E.V. and 13.3 ma./cm.$^2$, 1.08 E.V. and 13.8 ma./cm.$^2$, and 0.67 E.V. and 9.5 ma./cm.$^2$. The combination of these three layers resulted in a converter with a net conversion efficiency from light energy to electrical power of 17.4%. In the second example of a three cell solar energy converter, the semiconductor materials used were aluminum antimonide, indium phosphide and germanium. With an energy gap of 1.88 E.V. and a current of 11.1 ma./cm.$^2$ for the aluminum antimonide layer, 1.25 E.V. and 12.0 ma./cm.$^2$ for the indium phosphide layer, and 0.82 E.V. and 9.7 ma./cm.$^2$ for the germanium layer, the resulting efficiency of light conversion from light energy to electrical power was 22%. When it is realized that a maximum conversion efficiency of only 11% has been attained to date with single silicon p-n junction photocells, it can be seen that the use of multiple layers represents a marked advance in the art of semiconductor solar energy converters.

It should be recognized that this invention is subject to modification in many ways. For example, the invention has been described in terms of a three layer solar energy converter. However, the solar spectrum can be divided up into even narrower bands of wavelengths and additional layers of semiconductor material provided whose energy gap is equal to the longest wavelength in each division of the solar spectrum. Since lesser amounts of the photon energy would then be dissipated as heat, it follows that an increase in the number of semiconductor layers in the energy converter results in an increase in the conversion efficiency from light energy to electrical power. In addition, it is not necessary for the layers to be connected in series and provided with equal currents in the manner described herein. It may be desirable instead to supply a certain voltage to another circuit. Thus, this voltage can be supplied by the output from one of the layers and the remaining layers connected in series or in parallel. Further, while this invention has been described in terms of light energy received from the sun, it is broadly contemplated that the light energy may be received from any source which has a frequency spectrum equivalent to that of the sun.

Thus, while a specific embodiment of the invention has been described above, it has nevertheless been shown that this embodiment is subject to considerable modification and change without departing from the scope of this invention which is a multi-layer solar energy converter with semiconductor layers of different energy gaps and each functioning only in the comparatively narrow region of the light frequency spectrum in which it is most efficient. Accordingly, all modifications and changes to the energy converter that fall within the scope of the appended claims are intended as part of this invention.

What is claimed:

1. The combination comprising a prime electrical power source for converting light to electrical power and providing an electrical output therefrom, said prime power source having a high efficiency of conversion per unit area thereof exposed to light, and an external circuit connected to the electrical output of said prime electrical power source and powered thereby, said prime electrical power source comprised of plural layers of semiconductor material, each said layer having a p-n junction and composed of a semiconductor material having an energy gap different from the energy gaps characterizing the semiconductor materials composing said other layers, said layers being arranged to receive light in descending order of their energy gaps with the light energy absorbed by each said layer being transmitted through the layer of next higher energy gap material.

2. The combination as defined in claim 1 wherein the n-type region of a layer is connected with the p-type region of the next lower energy gap layer.

3. The combination as defined in claim 2 further including a connection to the p-type region of the layer composed of the semiconductor material having the highest energy gap and a connection to the n-type region of the layer composed of the semiconductor material having the lowest energy gap.

4. The combination as defined in claim 1 further including connecting means common to the n-type regions of said layers and individual means connected to the p-type regions of said layers.

5. The combination as defined in claim 1 wherein the semiconductor materials of the layers are selected to permit substantially equal numbers of photons to be absorbed by each of said layers.

6. The combination as defined in claim 1 wherein the p-n junction of each said layer is produced by diffusing into one surface thereof an impurity of a conductivity determining type opposite to the conductivity type of said layer.

7. The combination as defined in claim 6 wherein said p-n junction is produced at a depth from the diffusion surface of about a minority carrier diffusion length from the depth of maximum generation in said layer of hole-electron pairs.

8. The combination as defined in claim 1 wherein the prime electrical power source is comprised of three said layers of semiconductor material.

9. The combination as defined in claim 8 wherein the semiconductor materials composing said three layers are cadmium selenide, silicon and gallium antimonide.

10. The combination as defined in claim 8 wherein the semiconductor materials composing said three layers are aluminum antimonide, indium phosphide and germanium.

11. The combination as defined in claim 1 wherein the p-type region of a layer is connected with the n-type region of the next lower energy gap layer.

12. The combination as defined in claim 11 further including a connection to the n-type region of the layer composed of the semiconductor material having the highest energy gap and a connection to the p-type region of the layer composed of the semiconductor material having the lowest energy gap.

13. The combination as defined in claim 1 further including connecting means common to the p-type regions of said layers and individual means connected to the n-type regions of said layers.

14. The combination as defined in claim 1 further including a connection to the p-type region of the layer composed of the semiconductor material having the highest energy gap, a connection to the n-type region of the layer composed of the semiconductor material having the lowest energy gap and said layers placed in contacting relation.

15. The combination as defined in claim 1 further including a connection to the n-type region of the layer composed of the semiconductor material having the highest energy gap, a connection to the p-type region of the layer composed of the semiconductor material having the lowest energy gap, and said layers placed in contacting relation.

16. A semiconductor device for converting light energy to electrical power and having a high efficiency of conversion per unit area thereof exposed to light, said device comprising plural layers of semiconductor material, each said layer having a p-n junction and composed of a semiconductor material having an energy gap different from the energy gap characterizing the semiconductor materials composing said other layers, said layers being arranged to receive light in the descending order of their energy gaps with the light energy absorbed by each said layer being transmitted through the layer of next higher energy gap material, and connections to at least two of said layers for delivering the electrical power generated therein.

17. A semiconductor device for converting light energy to electrical power and having a high efficiency of conversion per unit area thereof exposed to light, said device comprising at least two layers of semiconductor material, each said layer having a p-n junction and composed of a semiconductor material having an energy gap different from the energy gap characterizing the semiconductor material composing any other layer, said layers being arranged to receive light in the descending order of their energy gaps with the light energy absorbed by each said layer being transmitted through the layer of next higher energy gap material, and connections to said at least two layers for delivering the electrical power generated therein.

References Cited in the file of this patent

UNITED STATES PATENTS

| | | |
|---|---|---|
| 2,402,662 | Ohl | June 25, 1946 |
| 2,428,537 | Vessi et al. | Oct. 7, 1947 |
| 2,582,850 | Rose | Jan. 15, 1952 |
| 2,710,253 | Willardson et al. | June 7, 1955 |
| 2,728,809 | Falkenthal | Dec. 27, 1955 |
| 2,776,367 | Lehovec | Jan. 1, 1957 |
| 2,831,981 | Watts | Apr. 22, 1958 |

OTHER REFERENCES

Rittner: "The Physical Review," vol. 96, No. 6, pp. 1708–1709, December 1954.

Lange, B.: "Photoelements," Reinhold Publishing Corporation, New York, 1938, pp. 56–61, 53 and 35–36.

Bell Telephone Laboratories, "The Transistor," New York, 1951, p. 21.

UNITED STATES PATENT OFFICE
CERTIFICATION OF CORRECTION

Patent No. 2,949,498 August 16, 1960

Edmond D. Jackson

It is hereby certified that error appears in the above numbered patent requiring correction and that the said Letters Patent should read as corrected below.

Column 4, line 61, the formula should appear as shown below instead of as in the patent:

$$\lambda = hc/(1.591X10^{-12})e$$

Signed and sealed this 6th day of June 1961.

(SEAL)
Attest:

ERNEST W. SWIDER
Attesting Officer

DAVID L. LADD
Commissioner of Patents